United States Patent [19]

Basso et al.

[11] Patent Number: 5,143,103
[45] Date of Patent: Sep. 1, 1992

[54] APPARATUS FOR CLEANING AND DRYING WORKPIECES

[75] Inventors: James E. Basso, Hopewell Junction; Parmesh K. Bhalla, Pleasant Valley; John J. Chahine, Poughkeepsie, all of N.Y.; Daro Diddell, San Diego, Calif.; Gregory J. Earle, Wallkill; Edward P. Gabriel, Newburgh; Farrokh Yaghmaie, Hopewell Junction, all of N.Y.

[73] Assignee: International Business Machines Corporation, Armonk, N.Y.

[21] Appl. No.: 637,415

[22] Filed: Jan. 4, 1991

[51] Int. Cl.$^5$ .............................. B08B 3/12
[52] U.S. Cl. ........................ 134/98.1; 134/1; 134/99.2; 134/105; 134/107; 134/186; 134/902
[58] Field of Search ................. 134/1, 95, 98, 99, 102, 134/105, 107, 108, 135, 184, 186, 902

[56] References Cited

U.S. PATENT DOCUMENTS

| | | | |
|---|---|---|---|
| 3,638,666 | 2/1972 | Fishman | 134/95 X |
| 3,702,795 | 11/1972 | Wessells et al. | 134/184 X |
| 3,727,620 | 4/1973 | Orr | 134/95 |
| 3,893,869 | 7/1975 | Mayer et al. | 134/86 |
| 4,118,649 | 10/1978 | Shwartzman et al. | 310/337 |
| 4,132,567 | 1/1979 | Blackwood | 134/902 X |
| 4,543,130 | 9/1985 | Shwartzman | 134/1 |
| 4,749,440 | 6/1988 | Blackwood et al. | 134/902 X |
| 4,854,337 | 8/1989 | Bunkenburg et al. | 134/184 |
| 4,871,417 | 10/1989 | Nishizawa et al. | 134/902 X |

FOREIGN PATENT DOCUMENTS

| | | | |
|---|---|---|---|
| 59-920298 | 2/1983 | Japan . | |
| 60-92621 | 5/1985 | Japan . | |
| 0585890 | 12/1977 | U.S.S.R. | 134/108 |
| 983913 | 12/1982 | U.S.S.R. . | |
| 790671 | 2/1958 | United Kingdom | 134/1 |

*Primary Examiner*—Philip R. Coe
*Attorney, Agent, or Firm*—John A. Stemwedel

[57] ABSTRACT

An apparatus for cleaning and drying workpieces which comprises a closable chamber, means for introducing a cleaning solvent to the chamber, means for removing the solvent from the chamber, means for introducing an inert gas to the chamber, means for receiving workpieces and for moving the workpieces with respect to the level of the solvent, and means for transmitting megasonic energy with respect to the solvent.

14 Claims, 2 Drawing Sheets

APPARATUS FOR CLEANING AND DRYING WORKPIECES

FIELD OF THE INVENTION

The invention relates to improved drying apparatus for ultraclean workpieces, and more particularly, to a drying apparatus for use in semiconductor manufacturing or processing that enables the improved removal of organic material, microscopic particles, and water from the surfaces of semiconductor substrates and the like.

BACKGROUND ART

In the processing of semiconductor devices, the substrate in which devices are fabricated undergoes a number of operations that are sequentially arranged to add to or subtract from the substrate layers or other features or to alter such layers or features. As the degree or scale of integration has increased in such devices, the need to preclude contaminants of all kinds has increased as well.

It is common to have multiple cleaning steps for every "productive" step. Thus, prior to each productive step the substrate will be cleaned to an ultraclean state. Associated with each cleaning step will be a number of cleaning operations which may include a hot acid cleaning, a hot base cleaning, a stripping operation or other wet or dry operation. Included with such associated cleaning steps will be a step to remove the cleaning agent and put the workpiece in a clean, dry condition for the next operation. Since entrained contamination can drastically alter the patterns produced, additively or subtractively, changing the integrity of the circuit, device, or the like, proper cleaning after photolithography and plasma etching is essential in order to achieve and maintain yields.

Particular problems in processing result from incompletely cleaned and/or dried workpieces. If organic materials are not completely removed; or if water spots, streaks or films are not dried and/or removed, the residues, hazes and/or organic films remaining on the workpiece may adversely interfere with the next level/layer of processing. Thus it is possible that the next layer of material to be applied will not properly adhere to the structure being formed, or the contaminants may otherwise interfere with subsequent processing to make further manufacturing steps ineffective, prohibitively expensive or no longer beneficial. Additionally, in building devices, it is noted that the structures become non-planar when patterns are formed in or on the substrate. These patterns can include grooves, trenches or holes as well as hills and valleys on the surface where particulate material and/or moisture may be trapped. Microparticles can lead to the creation of defects in the devices being fabricated, for example, causing shadows in a lithographic process or being metallized in a sputtering, evaporation or CVD process. In a similar manner, particulates may be trapped in a crevase in the structure and cause void formation or improper nucleation in some subsequent process steps.

U.S. Pat. Nos. 3,893,869 and 4,118,649 show cleaning apparatuses having an open cleaning tank which is adapted to have the cleaning fluid disposed therein energized by megasonic (ultrasonic) transducers. Megasonic energy is understood to be high energy ultrasonic energy in the frequency range from about 0.2 to 5 MHz. U.S. Pat. No. 4,543,730 provides a megasonic cleaning apparatus and a method for its use in cleaning semiconductor wafers and the like. This apparatus includes a buffer or intermediate closed tank to transfer (safely) the megasonic energy from transducers to an open cleaning tank in order to permit volatile, explosive cleaning fluids including alcohols to be used. No drying means are provided.

U.S. Pat. No. 4,854,337 is directed to a megasonic apparatus for cleaning semiconductor wafers arranged to accept the wafers to be cleaned in cassettes that dispose the wafers in a parallel vertical fashion and provides means to move the upwardly radiating megasonic transducers below and parallel to the surfaces of the wafers. The apparatus is open to the atmosphere.

Japanese Published Patent Application No. 59-202298 (English abstract) discloses the use of ultrasonic waves and organic cleaning solutions including alcohols for removing thermoplastic residued from molds.

Japanese Published Patent Application No. 60-92621 (English abstract) relates to a precision washing method that immerses workpieces in an organic solvent and thereafter sequentially treats them with alcohol, water, hydrogen peroxide solution, and ammonia solution, and then dries the workpieces by spinning or vacuum ethanol.

Soviet Union Patent Publication No. 983,913 (English abstract) is directed to improving the impregnation of electrical items by a cleaning process which entails preheating aromatic hydrocarbons, placing the items to be impregnated in such solution, reducing the pressure to vaporize the cleaning solution, increasing the pressure, and repeating the pressure reduction and pressure increase steps a number of times.

Workpieces have also been cleaned and dried in apparatus which include a spin dryer. Such apparatus does not produce streak free, particulate free workpieces because of uneven drying rates and redeposition of microparticles due to electrostatic forces.

SUMMARY OF THE INVENTION

The present invention provides an apparatus for cleaning and drying workpieces. The apparatus includes a chamber which is closable to the atmosphere, means for introducing a cleaning solvent to the chamber, means for controlling the solvent level in the chamber, means for receiving workpieces to be cleaned, means for introducing an inert gas to the chamber, means for moving the workpieces with respect to the solvent level, means for applying megasonic (high intensity ultrasonic) energy to the solvent in the chamber, means for removing the solvent from the chamber, means for evacuating the chamber, and means for cooling the chamber to ambient temperature.

A preferred embodiment of the invention provides an apparatus including the means for the removal of microparticles, organic contamination, and water and inorganic contamination and for drying such cleaned workpieces.

The invention also provides a method to clean and dry workpieces to an ultrapure state including the steps of placing the workpieces into an apparatus having a chamber which is closable to the atmosphere, closing the chamber, introducing a cleaning solvent, moving the workpieces below the level of the cleaning solvent, introducing a blanket of inert gas over the cleaning solvent, applying megasonic energy to the cleaning solvent to dislodge microparticles, dissolving organic films and rapidly removing the workpieces from the cleaning solvent, removing the cleaning solvent from the chamber and evacuating the chamber to a pressure less than the partial pressure of the cleaning solvent, and cooling the chamber to ambient temperature to prevent redeposition of microparticles by thermophoresis.

DETAILED DESCRIPTION OF THE PREFERRED EMBODIMENTS

Figure 1:
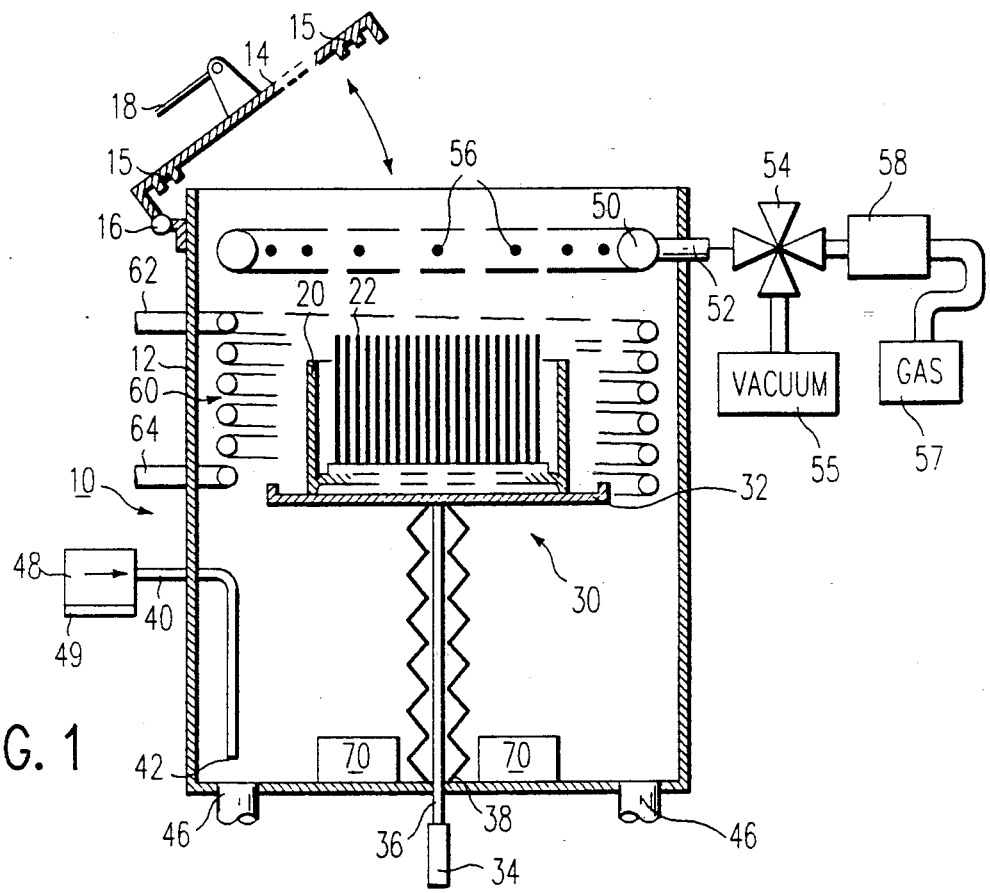
FIG. 1 is a schematic in elevation of the apparatus of the invention as it receives workpieces to be cleaned.
Figure 2:
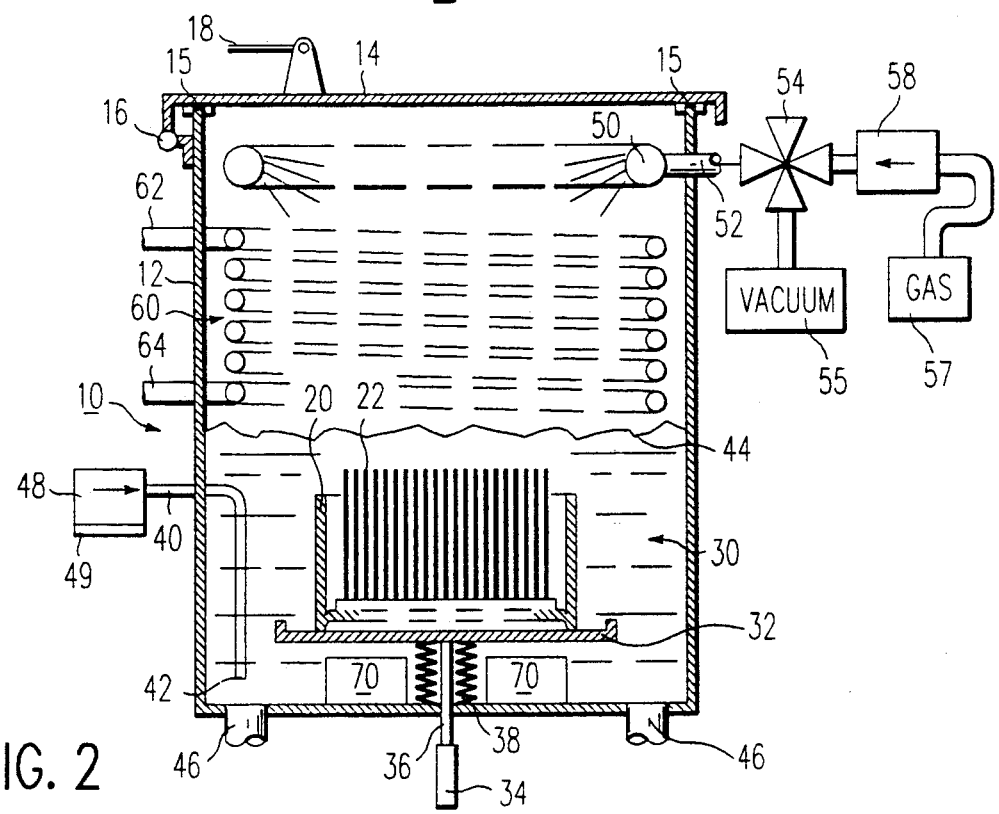
FIG. 2 is a schematic of the apparatus of FIG. 1 showing the workpieces during the cleaning step.
Figure 3:
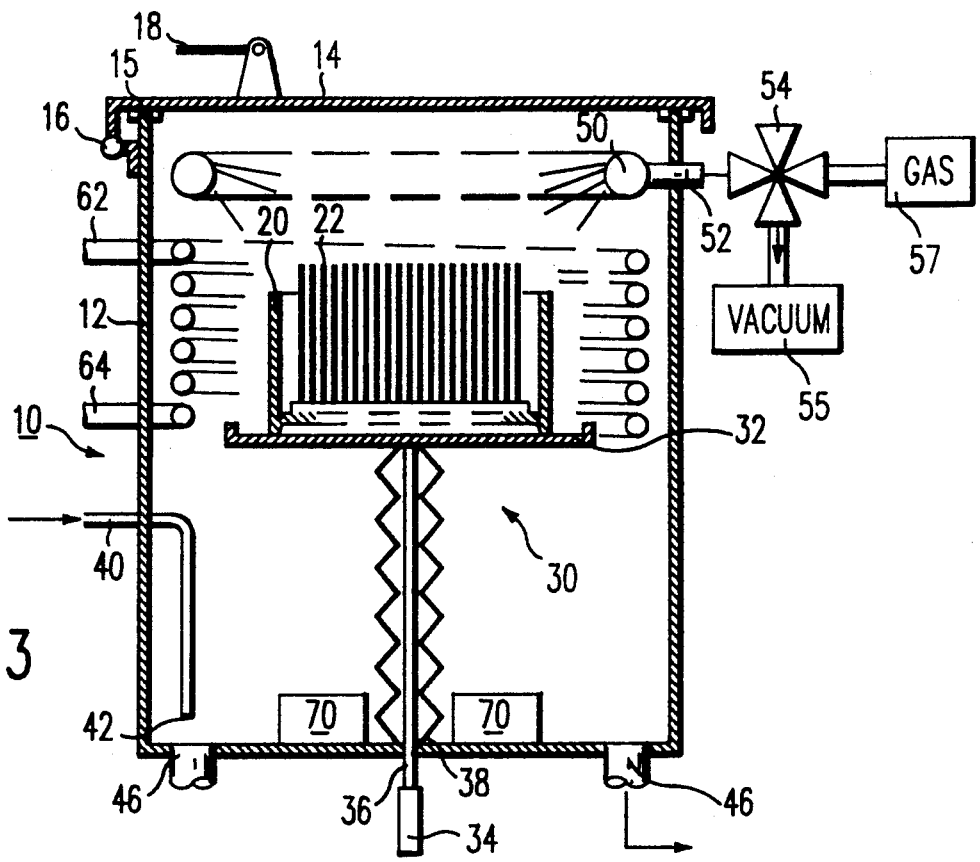
FIG. 3 is a schematic of the apparatus of FIG. 1 showing the workpieces during the drying step; and, FIG. 4 is a schematic view in elevation of another embodiment of the invention.

The cleaning/drying apparatus 10 as shown in FIGS. 1-3 comprises a tank 12 and a cover 14 attached to the tank through a hinge means 16. The cover is provided with a gasket 15 that engages the top of the side wall of the tank. Lifting arm 18 is provided to move the cover between open and closed positions. When the cover is closed upon the tank, an airtight cleaning/drying chamber is formed.

Positioned within the tank is a workpiece lifter assembly 30 which comprises a receiving platform 32, a lifting means 34 (here shown as actuator piston), and a connecting rod 36 between the receiving platform and the lifting means. A sealing means 38 (here a bellows) is provided to permit the connecting rod to pass through the floor of the tank.

Cleaning solvent is admitted to the tank by inlet pipe 40 from a reservoir 48. The reservoir may be equipped with a heating means 49 in order that the cleaning solution be introduced at a desired elevated temperature. The inlet pipe terminates in a discharge tube 42 which is positioned below the final solvent level 44 (as shown in FIG. 2). One or more drains or outlets 46 are positioned in the bottom of the tank in order to permit the complete and rapid removal of the cleaning solvent from the tank.

A gas handling manifold 50 is positioned in the tank at a level substantially above the final solvent level. A pipe 52 connects the gas handling manifold to a multiposition valve 54. With the multiposition valve it is possible to introduce an inert gas to the manifold to pass through orifices 56 to pressurize the tank. By the same token the valve may be adjusted in order to permit the drawing of a vacuum in the tank.

A cooling coil 60 is positioned in the tank above the cleaning solvent level. A refrigerant passes through the coil from inlet 62 to outlet 64. The refrigerant may be a chilled liquid or any of the well known refrigerant gases, e.g. the Freon chlorofluorocarbon materials. A compressor may be associated with the cooling coil.

A workpiece carrier 20 adapted to hold one or more workpieces in a desired orientation with respect to the cleaning/drying chamber is provided. This workpiece carrier may be placed in spaced relationship to the workpiece lifter assembly 30. As is shown, workpieces 22 may be fastened on the workpiece carrier. The workpieces may be semiconductor wafers.

Megasonics transducers 70 are shown mounted within the tank on its bottom wall. These piezoelectric devices are well known, see for example U.S. Pat. Nos. 3,893,869 and 4,118,649.

Figure 4:
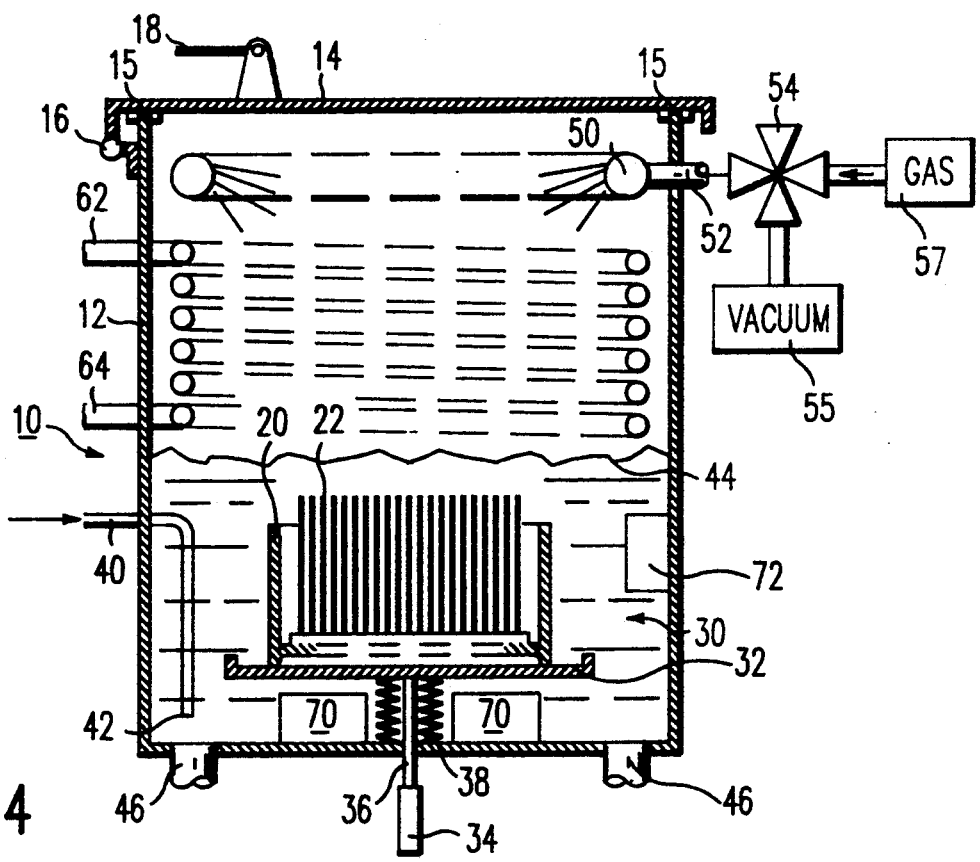

FIG. 4 shows another embodiment of the cleaning/drying apparatus, similar to that showing in FIGS. 1-3, but having an additional megasonic transducer 72 positioned inside the tank on the sidewall at a level of the mid point of the workpiece away from the surfaces to be cleaned. The megasonic energy is thus directed to urge any entrapped microparticle to move away from the surfaces of the workpieces.

In operation, referring to drawing FIGS. 1-3, the following process events and sequences will be utilized to provide ultrapure dry semiconductor wafers.

Semiconductor wafers 22 are positioned in wafer carrier 20 in an edge on fashion. The carrier may be a "boat" of the type often used in semiconductor processing. It is preferred that the wafers be held vertically with respect to the wafer carrier. The wafer carrier 20 is placed on the receiving platform 32 of lifter assembly 30. The lifter assembly is designed to dissipate any electrostatic charge that may be present in the post-clean and dry phase to prevent redeposition of any particulate contaminants. The wafer carrier is lowered into the tank 12 and the cover 14 is closed by means of lifting arm 18 which may be pneumatically actuated to close in sealing registry upon gasket 15.

A partial vacuum of about 200 torr is drawn on the closed tank 12 via vacuum line 55 which is connected to the gas handling manifold 50 by pipe 52 and multiposition valve 54. Thereafter, valve 54 is adjusted to admit argon gas from line 57 through valve 54 into the closed tank to atmosphere. It is preferred to have the argon heated sufficiently with heating means 58 to heat the walls of the chamber to 45°-50° C. Thus, the argon will typically be heated up to about 80° C. Nitrogen may also be used as a process gas. Key in the selection of the inert process gas is its nonflammability with respect to heated megasonically agitated isopropyl alcohol.

As shown in FIG. 2, heated isopropyl alcohol is introduced into the closed chamber from the reservoir through inlet pipe 40 to discharge tube 42 and is continued until the wafers which have been lowered in the chamber by actuator 34 are completely covered or submerged shown at solvent level 44. The argon introduced in the proceeding step forms an inert blanket over the heated isopropyl alcohol in the chamber.

Power is then applied to the megasonic generator 70 to provide a constant wave energy at about 0.2 to 5 MHz during the cleaning cycle. The preferred operating range is from about 950 KHz to 1.6 MHz at a power of up to about 500 w. The megasonic generator is kept on during the entire cleaning cycle. The isopropyl alcohol is removed via drain 46. (The waste or spent isopropyl alcohol may be reprocessed or recycled.) As the alcohol is being removed hot argon gas is introduced into the chamber and the wafer surfaces are heated to assist in the volatilization of the isopropyl alcohol on the wafer surfaces. When the alcohol has been removed (at least below the level of the workpieces), the megasonics generator is turned off. This will prevent any redeposition of microparticles onto the surface of the wafers. An argon temperature of about 50°-95° C. is desired, about 80° C. is preferred. After 50-95° C hot argon enters the chamber, the vacuum exhaust valve is open and the pressure in the chamber is reduced to 200 torr.

As shown in FIG. 3, a pneumatic lifter 34 lifts the receiving platform 32 and transfers the wafers to a cooling zone within cooling coil 60. The argon line is then shut off and the chamber pressure decreases to 100 torr.

A chilled liquid is fed to the cooling coil through inlet 62 to outlet 64 in order to return the wafers to room temperature. Then additional argon at room temperature is introduced to the chamber until atmospheric pressure is reached.

The chamber is then opened and the clean/dry wafers may be removed for further processing.

In the FIG. 4 embodiment, the wafers are positioned relative to the megasonics generator 72 so that the energy wave emitted by generator 72 hits the under or back side of the wafers, and urges particles entrapped in grooves, crevices, or trenches on the top or front side to be moved away from the wafers.

The following Tables show the improvements in cleaning over spin drying apparatus.

TABLE 1

Summary of X-ray Analysis of Trace Metals ($10^{12}$ atoms/cm$^2$)

|  | Cu | Zn | Ca | Ni | Cr | Fe |
|---|---|---|---|---|---|---|
| 1 (control) | N.D. | N.D. | N.D. | N.D. | N.D. | 0.1 |
| 2 (control) | N.D. | N.D. | N.D. | N.D. | N.D. | N.D. |
| 3 (control) | N.D. | N.D. | N.D. | N.D. | N.D. | 0.1 |
| 4 (spin dry) | N.D. | 0.4 | 0.09 | 0.1 | 0.1 | 0.3 |
| 5 (spin dry) | N.D. | 0.2 | N.D. | 0.1 | 0.1 | 0.3 |
| 6 (spin dry) | N.D. | 0.3 | N.D. | 0.09 | N.D. | 0.3 |
| 7 (present invention) | N.D. | N.D. | N.D. | N.D. | N.D. | 0.1 |
| 8 (present invention) | N.D. | N.D. | N.D. | N.D. | N.D. | 0.1 |
| 9 (present invention) | N.D. | N.D. | N.D. | N.D. | N.D. | N.D. |

N.D. = Not Detected 125 mm wafers with native oxide surfaces were used for the above testing. The control wafers provide a background reading, having undergone no wet processing. Results indicate clear advantages of apparatus and process of the present invention to conventional spin drying when trace metal contaminants are concerned. There appears to be no significant change in trace metals when using the apparatus of the invention.

TABLE 2

Summary of SIMS Analysis of surface contaminants (ions count/angstrom):

|  | Na | K | Cl | B | C |
|---|---|---|---|---|---|
| 1 (control) | 423 | 1320 | 0.1 | 40 | 40 |
| 2 (control) | 12000 | 58000 | 2.5 | 121 | 720 |
| 3 (control) | 410 | 2100 | 2.1 | 180 | 580 |
| 4 (spin dry) | 197 | 1980 | 1.3 | 31 | 510 |
| 5 (spin dry) | 182 | 1200 | 1.5 | 42 | 430 |
| 6 (spin dry) | 210 | 1750 | 2.2 | 38 | 395 |
| 7 (present invention) | 185 | 1580 | 0.5 | 38 | 110 |
| 8 (present invention) | 310 | 1690 | 2.5 | 42 | 55 |
| 9 (present invention) | 482 | 1210 | 1.1 | 39 | 90 |

This Secondary Ion Mass Spectroscopy data indicates that, except for Carbon, other elements are about the same level of concentration in 3 groups of samples. Carbon content of samples treated with the apparatus of present invention is lower than other samples showing the ability of the apparatus of the present invention to remove organics.

The following comparative table shows the particulate contamination experienced with commercial dryers.

TABLE 3

Summary of Surface Scanning Counts . . . Pre & Post Spin Dryer (Particles/wafer) 0.5 $\mu$m or greater

| Sample (1) | ; Dryer #A |
|---|---|
| Pre | 19 particles |
| Post | 31 particles |
| Sample (2) | ; Dryer #B |
| Pre | 5 particles |
| Post | 27 particles |
| Sample (3) | ; Dryer #C |
| Pre | 18 particles |
| Post | 32 particles |
| Sample (4) | ; Dryer #D |
| Pre | 19 particles |
| Post | 43 particles |

Each of the spin dryers A-D was located in a Class 10 clean room. Above data confirms that current spin drying technology adds by a range of 12 to 24 particles per wafer.

While having described the operation of the process using isopropyl alcohol, other solvents may be conveniently used including low molecular weight alcohols and ketones, ethyl alcohol and acetone are especially useful. Where only the removal of microparticles and the dissolution of organic films is desired, chlorofluorocarbons (Freons) may be used. No exotic solvents are required for the operation of the apparatus of the invention.

While only the preferred embodiments of the present invention are described above, many potential modifications which fall within the generic concept will occur to those skilled in the art upon a reading of the present disclosure. Such modifications in terms of order, arrangement or sequence so long as the apparatus and method are functionally equivalent to that as herein set forth are within the teaching of the present invention and within its scope as set forth in the claims which follows.

What is claimed is:

1. An apparatus for cleaning and drying workpieces comprising a closed chamber, means for introducing a cleaning solvent to said chamber to a desired fill level, means for removing said solvent from said chamber, means for introducing an inert gas to said chamber and means for evacuating said chamber comprising a manifold disposed in said chamber and a multi-position valve disposed outside said chamber and connected to said manifold by means of a pipe extending through a wall of said chamber, means for supporting a workpiece carrier on a workpiece lifter which is movable with respect to said desired fill level of said cleaning solution, and means for transmitting megasonic energy to said solvent.

2. The apparatus of claim 1 wherein said chamber comprises a tank and a cover in movable engagement therewith.

3. The apparatus of claim 1 wherein said cleaning solvent is a low molecular weight alcohol, ketone or chlorofluorocarbon.

4. The apparatus of claim 3 wherein said cleaning solvent is isopropyl alcohol, ethyl alcohol or acetone.

5. The apparatus of claim 4 wherein said cleaning solvent is isopropyl alcohol.

6. The apparatus of claim 1 which further comprises a cooling coil disposed in said chamber.

7. The apparatus of claim 1 wherein said means for transmitting megasonic energy is a megasonic transducer.

8. The apparatus of claim 7 wherein said megasonic transducer is disposed so as to transmit said energy in a direction generally normal to the surface of said solvent.

9. The apparatus of claim 8 wherein an additional megasonic transducer is positioned on the sidewall of said chamber.

10. The apparatus of claim 1 wherein said inert gas is nitrogen or argon.

11. The apparatus of claim 1 and further including means for heating said solvent prior to introduction of said solvent into said chamber.

12. The apparatus of claim 1 wherein means are provided for heating said inert gas.

13. The apparatus of claim 1 wherein said means for transmitting megasonic energy has a frequency range from about 0.2 to 5 MHz.

14. The apparatus of claim 13 wherein said means for transmitting megasonic energy has a frequency range from about 0.95–1.6 MHz.

* * * * *